US009391078B1

(12) United States Patent
Liu et al.

(10) Patent No.: US 9,391,078 B1
(45) Date of Patent: Jul. 12, 2016

(54) METHOD AND STRUCTURE FOR FINFET DEVICES

(71) Applicant: Taiwan Semiconductor Manufacturing Company, Ltd., Hsin-Chu (TW)

(72) Inventors: CheeWee Liu, Hsin-Chu (TW);
Wen-Hsien Tu, Hsin-Chu (TW);
Shih-Hsien Huang, Hsin-Chu (TW);
Cheng-Yi Peng, Taipei (TW);
Chih-Sheng Chang, Hsunchu (TW);
Yee-Chia Yeo, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/599,323

(22) Filed: Jan. 16, 2015

(51) Int. Cl.
*H01L 27/092* (2006.01)
*H01L 29/78* (2006.01)
*H01L 29/165* (2006.01)
*H01L 29/267* (2006.01)
*H01L 21/8238* (2006.01)

(52) U.S. Cl.
CPC .... *H01L 27/0924* (2013.01); *H01L 21/823814* (2013.01); *H01L 21/823821* (2013.01); *H01L 29/165* (2013.01); *H01L 29/267* (2013.01); *H01L 29/7845* (2013.01)

(58) Field of Classification Search
CPC ............... H01L 21/823431; H01L 21/823821; H01L 27/0886; H01L 27/0924; H01L 21/10826; H01L 27/10879; H01L 29/4179; H01L 29/785
USPC .......... 257/288, 368, 369; 438/151, 197, 199, 438/938
See application file for complete search history.

(56) References Cited

U.S. PATENT DOCUMENTS

| | | | |
|---|---|---|---|
| 7,667,271 B2 | 2/2010 | Yu et al. |
| 8,362,575 B2 | 1/2013 | Kwok et al. |
| 8,367,498 B2 | 2/2013 | Chang et al. |
| 8,440,517 B2 | 5/2013 | Lin et al. |
| 8,497,528 B2 | 7/2013 | Lee et al. |
| 8,610,240 B2 | 12/2013 | Lee et al. |
| 8,680,576 B2 | 3/2014 | Ching et al. |
| 8,723,272 B2 | 5/2014 | Liu et al. |
| 8,729,627 B2 | 5/2014 | Cheng et al. |
| 8,729,634 B2 | 5/2014 | Shen et al. |
| 8,785,285 B2 | 7/2014 | Tsai et al. |
| 8,796,759 B2 | 8/2014 | Perng et al. |
| 8,809,139 B2 | 8/2014 | Huang et al. |
| 8,828,823 B2 | 9/2014 | Liu et al. |
| 8,836,016 B2 | 9/2014 | Wu et al. |
| 8,841,701 B2 | 9/2014 | Lin et al. |
| 8,847,293 B2 | 9/2014 | Lee et al. |
| 8,853,025 B2 | 10/2014 | Zhang et al. |
| 2011/0068407 A1 | 3/2011 | Yeh et al. |

(Continued)

*Primary Examiner* — Jarrett Stark
*Assistant Examiner* — Shahed Ahmed
(74) *Attorney, Agent, or Firm* — Haynes and Boone, LLP

(57) ABSTRACT

A semiconductor device and a method of forming the same are disclosed. The device comprises a semiconductor substrate comprised of a first semiconductor material and having a plurality of isolation features, thereby defining a first active region and a second active region; a first fin semiconductor feature comprised of a second semiconductor material and formed in the first active region; and a second fin semiconductor feature comprised of a second semiconductor material and formed in the second active region. The first fin semiconductor feature is tensile strained and the second fin semiconductor feature is compressively strained.

20 Claims, 8 Drawing Sheets

(56) References Cited

U.S. PATENT DOCUMENTS

| | | |
|---|---|---|
| 2013/0011983 A1 | 1/2013 | Tsai et al. |
| 2014/0151766 A1* | 6/2014 | Eneman .............. H01L 29/1054 257/288 |
| 2014/0252412 A1 | 9/2014 | Tsai et al. |
| 2015/0318176 A1* | 11/2015 | Qi ..................... H01L 21/26513 438/283 |
| 2016/0027876 A1* | 1/2016 | Lee ..................... H01L 29/1054 257/369 |

* cited by examiner

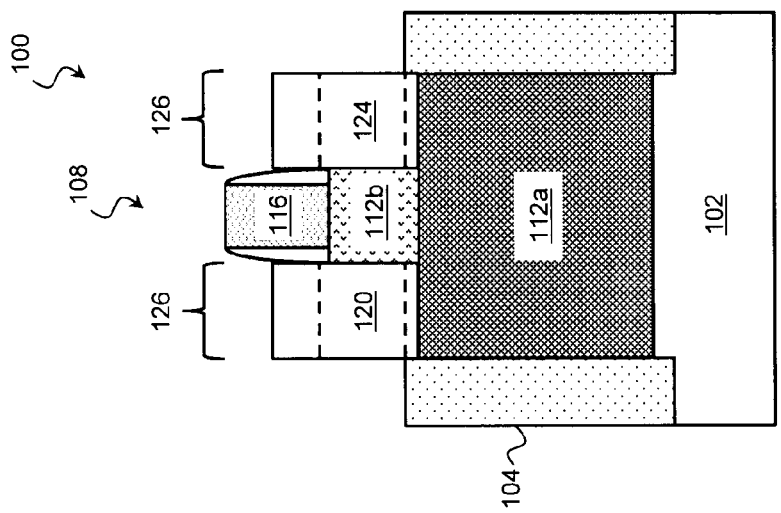
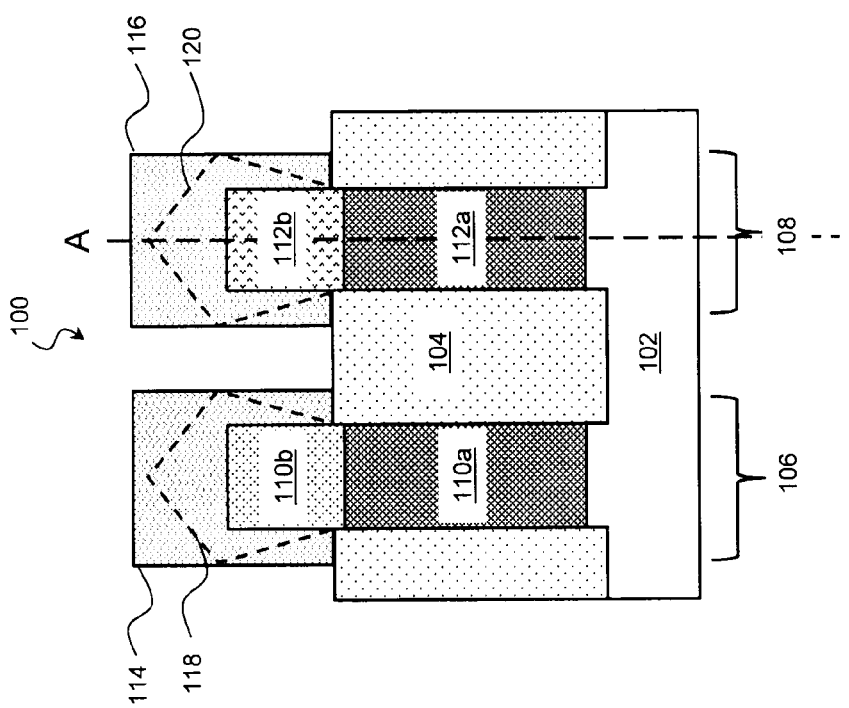
Figure 1B
Figure 1A

METHOD AND STRUCTURE FOR FINFET DEVICES

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs.

For multiple reasons including facilitating the scaling down process, three-dimensional devices such as fin-type field effect transistors (finFETs) have been developed for their high drive currents with small footprints compared to traditional planar device. Devices such as these have unique considerations associated therewith, and improvements are desired in this area.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 1A-1B are cross-sectional views of a semiconductor device, according to various aspects of the present disclosure.

DETAILED DESCRIPTION

Figure 2:
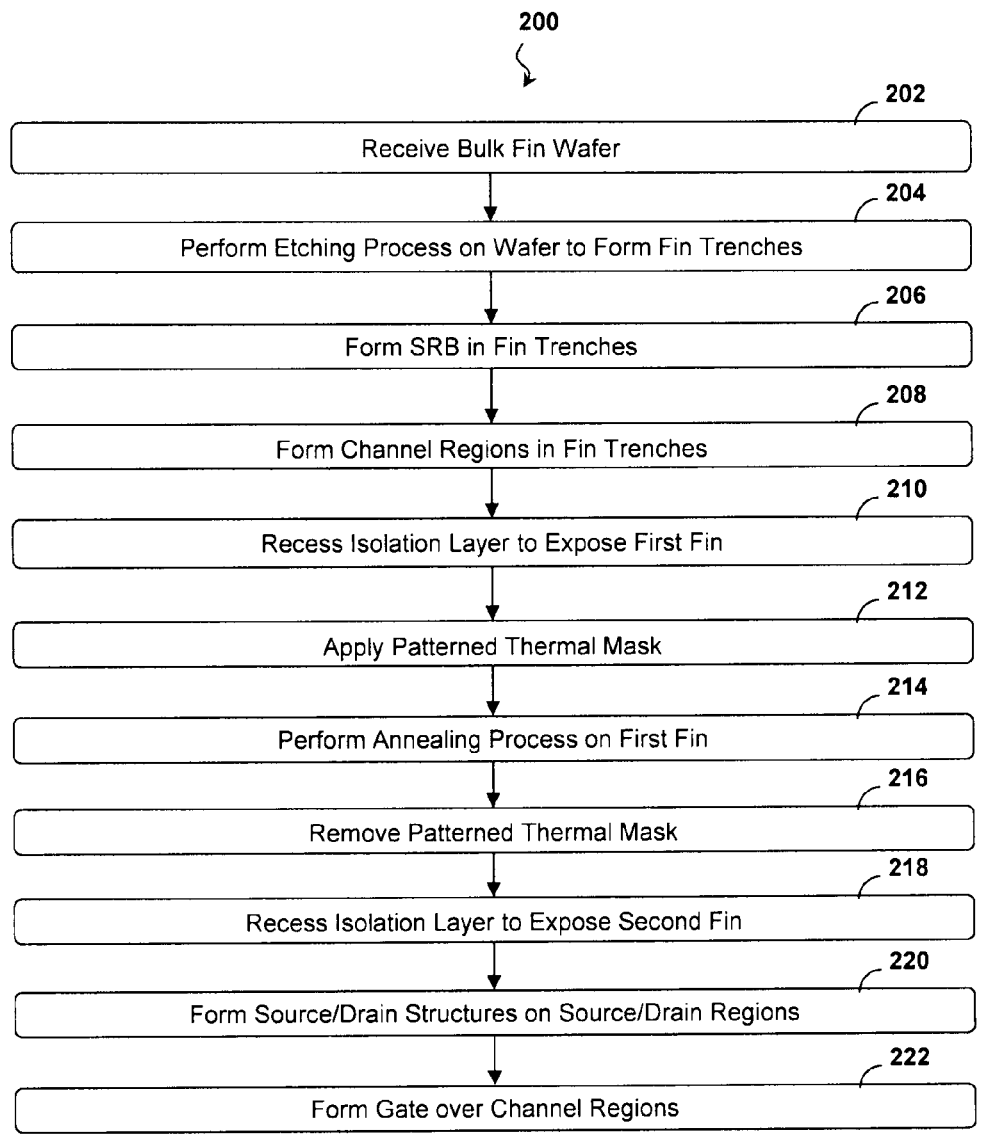
FIG. 2 shows a flow chart of a method of fabricating a semiconductor device, according to various aspects of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure is generally related to semiconductor devices, and more particularly to semiconductor devices having multi-gate FETs, such as double gate FETs, tri-gate FETs, and FinFETs. It is an objective of the present disclosure to provide methods for and structures of semiconductor devices in which both n-type and p-type devices are constructed of the same material, and n-type and p-type properties are derived from inducing tensile (for n-type) and compressive (for p-type) stress in the channel regions of the devices.

FIG. 1A shows a cross-sectional view of a semiconductor device 100 constructed according to various aspects of the present disclosure. FIG. 1B shows a cross section view of the structure of FIG. 1A taken along line A-A. As will be shown, the device 100 illustrates a P-type FinFET and an N-type FinFET in one region of a substrate. This is provided for simplification and ease of understanding and does not necessarily limit the embodiment to any number of devices, any number of regions, or any configurations of regions. Furthermore, the FinFET device 100 may be an intermediate device fabricated during processing of an integrated circuit (IC), or a portion thereof, that may comprise static random access memory (SRAM) and/or other logic circuits, passive components such as resistors, capacitors, and inductors, and active components such as p-type FETs, n-type FETs, double gate FETs, tri-gate FETs, FinFETs, metal-oxide semiconductor field effect transistors (MOSFET), complementary metal-oxide semiconductor (CMOS) transistors, bipolar transistors, high voltage transistors, high frequency transistors, other memory cells, and combinations thereof.

Referring to FIGS. 1A and 1B, the device 100 includes a substrate 102 and an isolation structure 104 over the substrate 102. The device 100 includes a p-type FinFET 108 and an n-type FinFET 106 formed over the substrate 102. The FinFETs 106 and 108 have similar structures and will be described collectively below. The following discussion will refer to FinFET 106 and the reference numerals associated therewith. The reference numerals associated with FinFET 108 will be presented in parenthesis.

The FinFET 106 (108) includes a channel region 110b (112b) projecting from the substrate 102 upwardly (along the "z" direction) through the isolation structure 104 as a first (second) fin. The FinFET 106 (108) further includes a gate structure 114 (116) over the isolation structure 104 and engaging the channel regions 110b (112b) on three sides thereof (top surface and sidewalls). In some embodiments, the gate structure 114 (116) may engage the respective fins on two sides, e.g., the sidewalls of the fins. The FinFET 106 (108) further includes source/drain structures 118 (120) and 122 (124) formed over the isolation structure 104 in source/drain regions 126, each engaging the channel regions 110b (112b) on one side thereof and displaced from each other such that the gate structure 114 (116) and the channel region 110b (112b) itself separate the source/drain structure 118 (120) from the source/drain structure 122 (124). The various elements of the device 100 will be further described in the following sections.

Referring now to FIG. 2, a flow chart of a method 200 is illustrated according to various aspects of the present disclosure in forming a semiconductor device, such as the semiconductor device 100 of FIGS. 1A and 1B. The method 200 is merely an example, and is not intended to limit the present disclosure beyond what is explicitly recited in the claims. Additional operations can be provided before, during, and after the method 200, and some operations described can be replaced, eliminated, or moved around for additional embodiments of the method. The method 200 is described below in conjunction with FIGS. 3A-3H that illustrate cross-sectional views of a semiconductor device at various stages of the manufacturing.

Figure 3B:
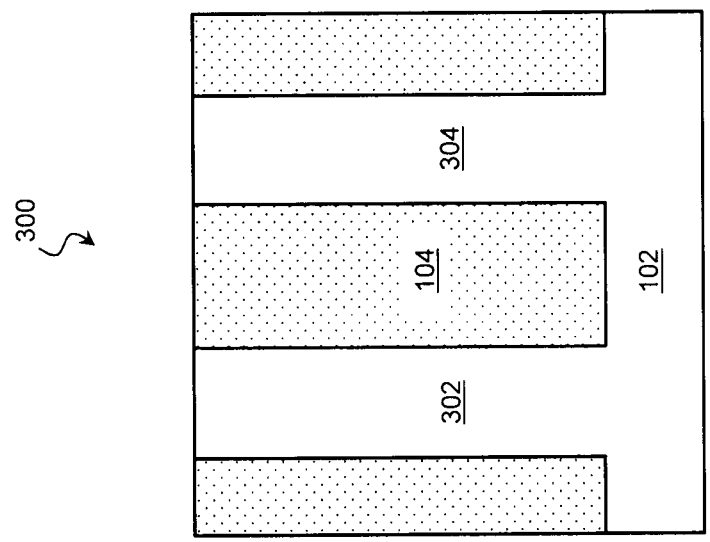
FIGS. 3A-3J are cross sectional views of forming a semiconductor device according to the method of FIG. 2, in accordance with some embodiments.
Figure 3A:
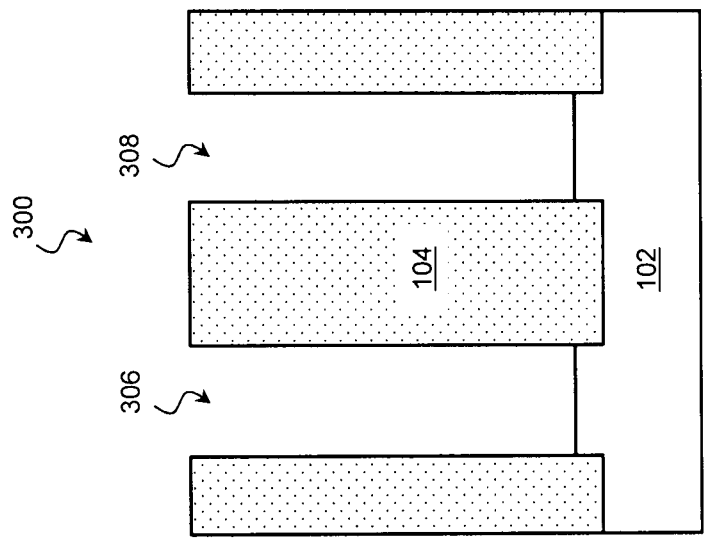

Beginning the process at operation 202 and referring to FIG. 3A, a bulk fin wafer 300 is received that includes a substrate 102 with one or more raised regions (e.g., regions 302 and 304) separated by isolation structures 104.

The substrate 102 is a silicon substrate in an exemplary embodiment. Alternatively, the substrate 102 may comprise another elementary semiconductor, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof.

In an exemplary embodiment the isolation structure 104 is formed of a dielectric material such as silicon oxide, silicon nitride, silicon oxynitride, fluoride-doped silicate glass (FSG), a low-k dielectric material, and/or other suitable insulating material. In some embodiments the isolation structure 104 includes shallow trench isolation (STI) features. In furtherance of the embodiments, the STI features are formed by a procedure such as the following: the substrate 102 is etched within the gaps between the substrate regions 302 and 304 using a hard mask layer such as an etch mask. In the present embodiment, the etching process etches through the substrate 102. The etching process may include any suitable etching technique such as dry etching, wet etching, and/or other etching methods (e.g., RIE). In some embodiments, the etching process includes multiple etching steps with different etching chemistries, each targeting a particular material. By the etching process, isolation feature trenches are formed in the substrate 102. A dielectric material is subsequently deposited within the isolation feature trenches to form the isolation features 104. Suitable fill materials include semiconductor oxides, semiconductor nitrides, semiconductor oxynitrides, FSG, low-K dielectric materials, and/or combinations thereof. In various exemplary embodiments, the dielectric material is deposited using a HDP-CVD process, a sub-atmospheric CVD (SACVD) process, a high-aspect ratio process (HARP), and/or a spin-on process. In one such embodiment, a CVD process is used to deposit a flowable dielectric material that includes both a dielectric material and a solvent in a liquid or semiliquid state. A curing process is used to drive off the solvent, leaving behind the dielectric material in its solid state.

Referring to FIG. 3B and moving to operation 204, substrate regions 302 and 304 are etched away to form fin trenches 306 and 308. In an exemplary embodiment this etching may be achieved by photolithography. In such an embodiment, a photoresist layer (or resist) may be formed over the isolation structure 104 and the substrate regions 302 and 304. An exemplary resist layer includes a photosensitive material that causes the layer to undergo a property change when exposed to light. This property change can be used to selectively remove exposed or unexposed portions of the resist layer by a developing process. Accordingly, this type of procedure to form a patterned resist layer may be referred to as lithographic patterning.

In one embodiment, the resist layer is patterned to leave the portions of the photoresist material disposed over the isolation structure 104 by the lithography process. After patterning the resist, an etching process is performed to remove a portion of region 302 and region 304 and thereby define fin trenches 306 and 308. The remaining resist layer may be removed after etching the fin trenches 306 and 308. An exemplary lithography process includes spin-on coating a resist layer, soft baking of the resist layer, mask aligning, exposure, post-exposure baking, developing the resist layer, rinsing, and drying (e.g., hard baking). Alternatively, a lithographic process may be implemented, supplemented, or replaced by other methods such as maskless photolithography, electron-beam writing, and ion-beam writing.

Figure 3D:
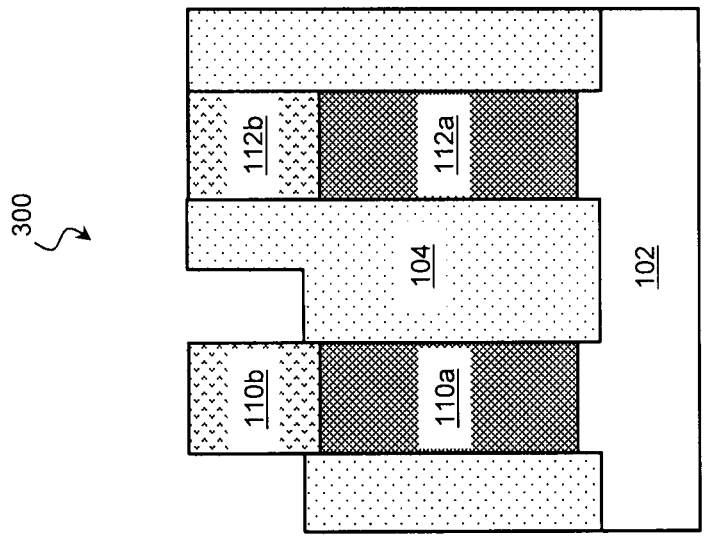
Figure 3C:
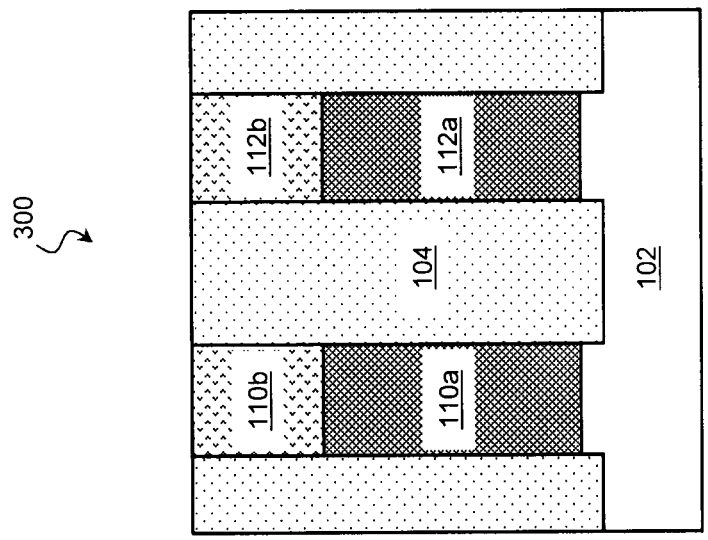

Referring now to FIG. 3C and moving to operation 206, strain relaxed buffer (SRB) layers 110a and 112a are epitaxially grown in a bottom portion of fin trenches 306 and 308, respectively. Suitable growth processes include atomic layer deposition (ALD), chemical vapor deposition (CVD), high-density plasma CVD (HDP-CVD), physical vapor deposition (PVD) and/or other suitable deposition processes. The SRB layers 110a and 112a may be different in composition from the substrate 102 in order to create lattice strain at the interface with the substrate 102. In an exemplary embodiment, the SRB layers 110a and 112a include $Si_{1-x}Ge_x$ where x<1.

Moving to operation 208, channel regions 110b and 112b are epitaxially grown on top of SRB layers 110a and 112a, respectively, within fin trenches 306 and 308, respectively. In an exemplary embodiment each of the channel regions 110b and 112b are composed of the same material while being different in composition from the SRB layers 110a and 112a. In an exemplary embodiment that material is $Si_{1-y}Ge_y$ where y>x. Alternatively, the channel regions 110b and 112b may be formed of a III-V group material such as Ge, GeSn, InGaP, InAs, InP, InGaAs, GaSa, InSb, GaSb or AlGaAs. The material for the channel regions 110b and 112b may be selected based on their mobility (e.g., greater than Si), their ability to be epitaxially grown without defects, and/or other suitable factors. As grown, the channel regions 110b and 112b are compressively strained due to the difference in lattice sizes between the SRB layers 110a and 112a and the channel regions 110b and 112b.

Referring now to FIG. 3D and moving to operation 210, a region of isolation layer 104 is recessed down to about the level of SRB 110a in order to expose the sides of channel region 110b, thereby exposing channel region 110b as a first fin. In an exemplary embodiment this recessing is achieved by etching, which may be photolithographic etching. Alternatively, other suitable etching techniques may be used. During the etching process, channel region 112b and SRB 112a and the region of isolation layer 104 surrounding them are covered by the appropriate mask so as not to be etched.

Figure 3F:
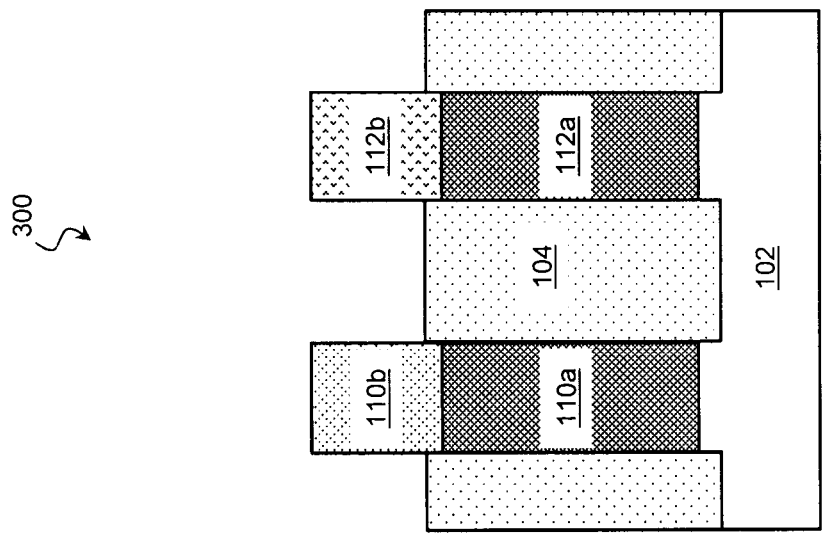
Figure 3E:
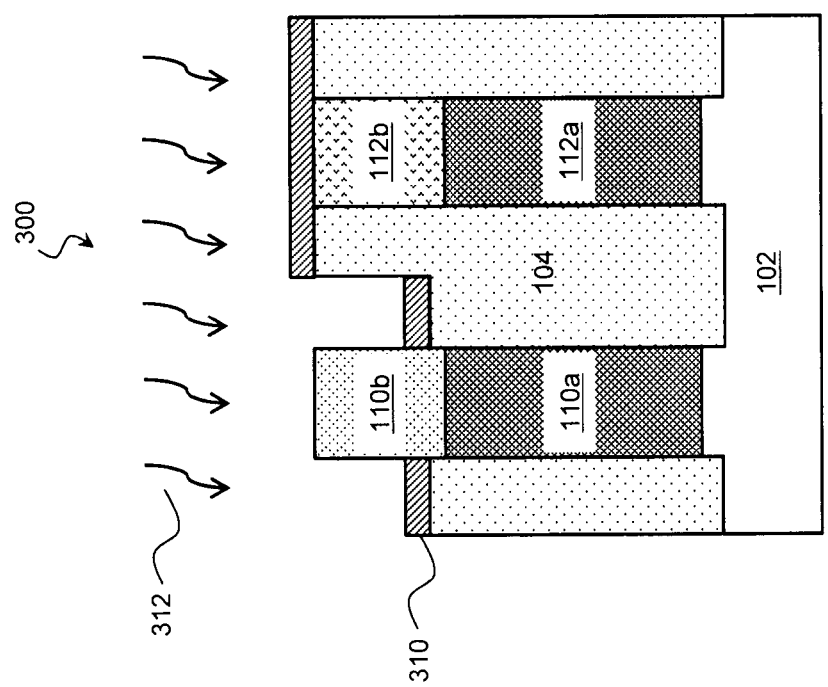

Referring now to FIG. 3E and moving to operation 212, a patterned thermal mask 310 is applied to the surface of the wafer 300 to protect channel region 112b while leaving channel region 110b exposed. In an exemplary embodiment, the patterned thermal mask 310 is a distributed Bragg reflector (DBR).

Figure 4:
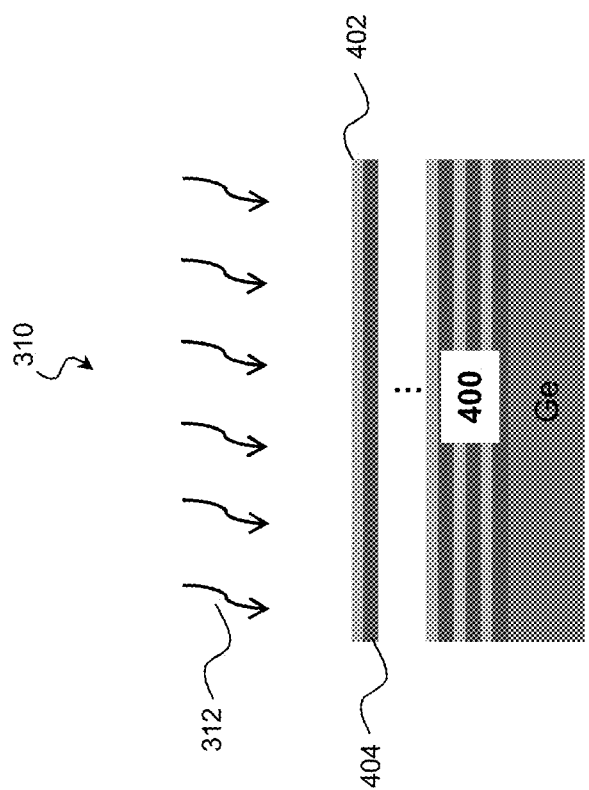
FIG. 4 is a cross-sectional view of a Distributed Bragg Reflector, which may be used as a thermal mask according to various aspects of the present disclosure.

Referring now to FIG. 4, there is shown a DBR 400 composed of 10 layers of $Si_3N_4/SiO_2$ pairs, which is used as a thermal mask 310. The DBR 400 is designed to reflect energy from an annealing process 312 using a wavelength of 532 nm, and as a result the layers 402 of $Si_3N_4$ and 404 of $SiO_2$ are each 75 nm thick. The DBR 400 can be designed with different thicknesses of the $Si_3N_4$ and $SiO_2$ layers in order to reflect energy from an annealing process 312 using different wavelengths. In another exemplary embodiment, the patterned thermal mask 310 is a metal mask or a contact etch stop layer (CESL).

Figure 5:
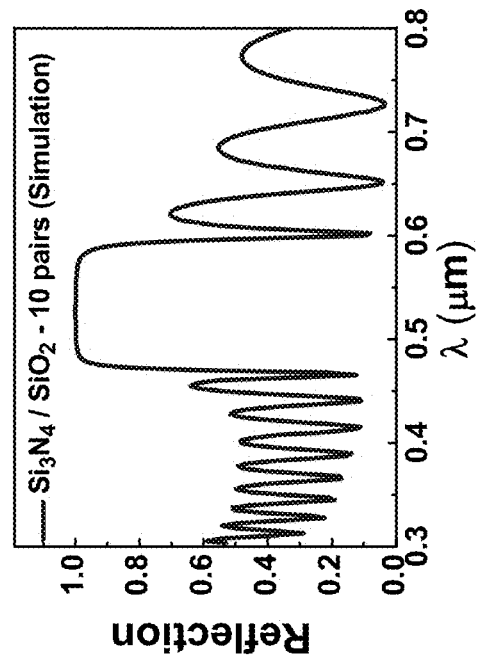
FIG. 5 is a graph of the reflectance of the Distributed Bragg Reflector of FIG. 4, according to various aspects of the present disclosure.

Referring to FIG. 5 there is shown a graph of the reflectance of an exemplary DBR 400 as shown in FIG. 4. In this embodiment, the DBR 400 is calibrated for a source of wavelength 532 nm. Therefore the DBR 400 reflects substantially all light in the band around 532 nm.

Referring again to FIG. 3E and moving to operation 214, an annealing process 312 is performed on the wafer 300. Due to the patterned thermal mask 310, the channel region 110b is selectively annealed. Some of the energy from the annealing process 312 reaches SRB layer 110a as well.

The annealing process 312 serves to reverse the strain on the channel region to which it is applied. In an exemplary embodiment, the annealing process 312 reverses the compressive strain on channel region 110b to tensile strain. In this embodiment, as channel region 110b is heated by the annealing process 312 the existing compressive strain is relaxed, resulting in an unstrained channel region 110b. Additionally, the amount of defects in the channel region 110b is reduced as the annealing process 312 heats up the channel region 110b. In this embodiment channel region 110b has a higher thermoelectric coefficient (TEC) than SRB layer 110a. Therefore, as the channel region 110b and SRB layer 110a cool down after annealing process 312 is complete, the SRB layer 110a contracts less than the channel region 110b, causing the channel region 110b to become tensile strained.

In an exemplary embodiment the annealing process 312 is a laser annealing process using a laser with a wavelength between 100 and 700 nm. In another exemplary embodiment the annealing process 312 is a flash annealing process using a flash lamp with a wavelength between 400 and 700 nm. In an exemplary embodiment the annealing process 312 reaches a maximum temperature in the range from 500 to 1000° C. In some embodiments, higher annealing temperature causes more pronounced strain within channel region 110b and an accompanying reduction in defects. Any suitable annealing technique may be used including laser annealing, flash annealing, and/or other suitable techniques.

Referring now to FIG. 3F and moving to operation 216, the patterned thermal mask 310 is removed from the surface of the wafer 300. Moving to operation 224, a region of isolation layer 104 is etched away down to the level of SRB 112a in order to expose channel region 112b, thereby exposing channel region 112b as a second fin. In an exemplary embodiment this etching may be achieved by photolithography. Alternatively, other suitable etching techniques may be used. During the etching process, channel region 110b and SRB 110a and the region of isolation layer 104 surrounding them are covered by the appropriate mask so as not to be etched.

Moving to operation 218, a region of isolation layer 104 is recessed down to about the level of SRB 112a in order to expose the sides of channel region 112b, creating a second fin. In an exemplary embodiment this recessing is achieved by etching, which may be photolithographic etching. Alternatively, other suitable etching techniques may be used. During the etching process, channel region 110b and SRB 110a and the region of isolation layer 104 surrounding them are covered by the appropriate mask so as not to be etched.

Figure 3H:
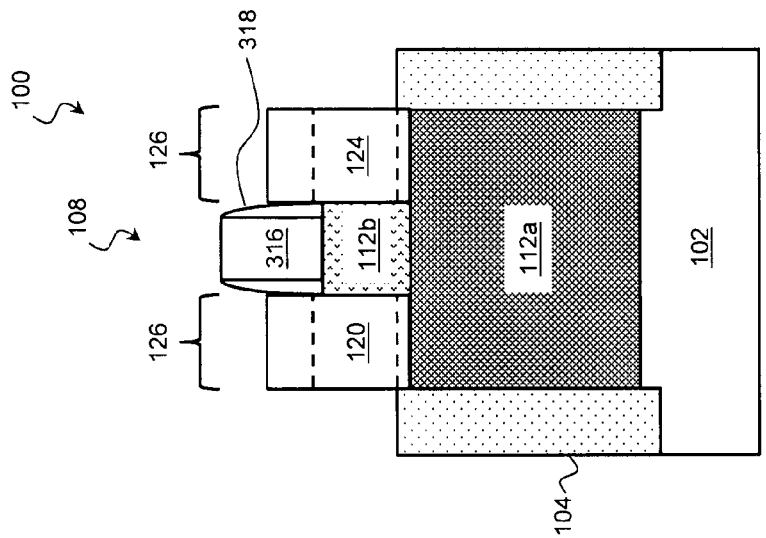
Figure 3G:
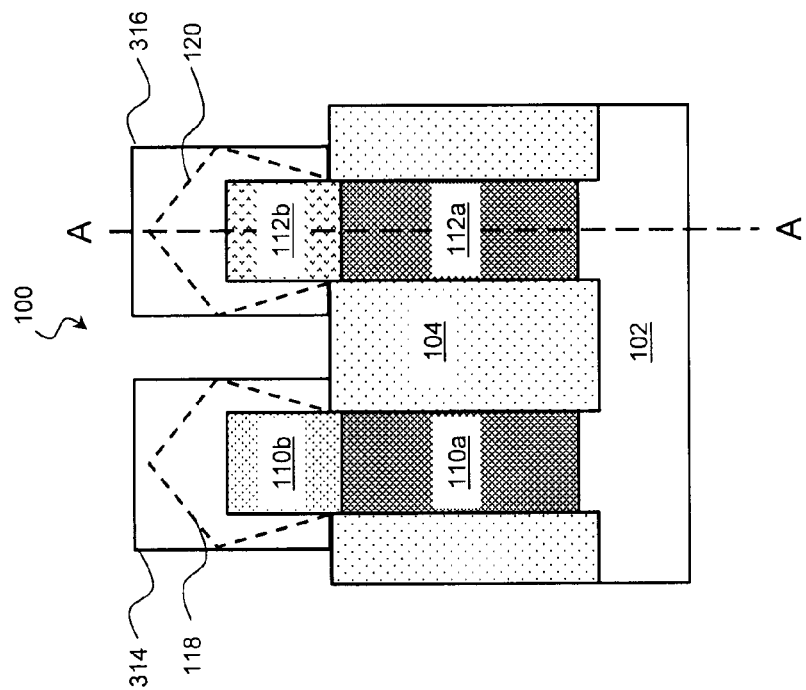

Referring now to FIGS. 3G and 3H (which is a cross-section of FIG. 3G along line A-A), in some embodiments, a protective structure such as a dummy gate 314 or 316 is formed over the channel regions 110b and 112b in preparation for formation of the source/drain structures 118, 120, 122 and 124. Forming the dummy gate 314 or 316 may include depositing a dummy gate layer containing polysilicon or other suitable material and patterning the layer in a lithographic process. A gate hard mask layer may be formed on the dummy gate layer. The gate hard mask layer may include any suitable material, such as a silicon oxide, a silicon nitride, a silicon carbide, a silicon oxynitride, other suitable materials, and/or combinations thereof. The formation of the dummy gate 314 or 316 includes deposition of gate material layers and patterning the gate material layers. In some embodiments, the patterning process includes forming a patterned resist layer; etching the hard mask layer using the patterned resist layer as an etch mask; and etching the gate material layers using the patterned hard mask layer as an etch mask.

In some embodiments, gate spacers or sidewall spacers 318 are formed on the sidewalls of the dummy gate 314 or 316. The gate spacers 318 may be used to offset the subsequently formed source/drain structures 118, 120, 122 and 124 and may be used for designing or modifying the source/drain structure (junction) profile. The gate spacers 318 may include any suitable dielectric material, such as a semiconductor oxide, a semiconductor nitride, a semiconductor carbide, a semiconductor oxynitride, other suitable materials, and/or combinations thereof. The formation of the gate spacer includes deposition and anisotropic etching, such as dry etching.

In some embodiments, a hard mask is formed over the channel regions 110b and 112b in source/drain regions 126 for use as a guiding feature to align the epitaxial growth of the source/drain structures 118, 120, 122 and 124 in subsequent operations. The hard mask forms on the surfaces of the channel regions 110b and 112b, including the upper surface and sidewall surfaces of the channel regions 110b and 112b. The hard mask may include any suitable dielectric material including semiconductor oxides, semiconductor nitrides, semiconductor oxynitrides, semiconductor carbides, combinations thereof, and/or other suitable materials. An exemplary hard mask includes silicon nitride. In various embodiments, the hard mask layer is formed using one or more suitable processes including thermal growth, ALD, CVD, HDP-CVD, PVD, and/or other suitable deposition processes.

In further preparation for the epitaxial growth of the source/drain structures 118, 120, 122 and 124 in subsequent operations, the hard mask within the source/drain regions 126 is etched. The etching removes substantially all of the semiconductor material in the channel regions 110b and 112b within the source/drain regions 126. The technique may leave a portion of the hard mask extending above the top surface of the semiconductor layer 120 in order to control and align the epitaxial growth of the source/drain structures 118, 120, 122 and 124. The etching may be performed as a single etching process or as multiple etching processes using a variety of etchants and techniques. In an exemplary embodiment, an anisotropic (directional) etching technique, such as an anisotropic dry etching technique, is used that etches the horizontal surfaces of the hard mask. In another exemplary embodiment, the etching includes multiple etching steps that further includes an anisotropic etching step to remove the top portion of the hard mask over the channel regions 110b and 112b, and a selective etching step (such as a wet etching) to selectively remove the semiconductor material of the channel regions 110b and 112b.

Moving to operation 220 and referring to FIGS. 3G and 3H, source/drain structures 118, 120, 122 and 124 are formed on source/drain regions 126. In some embodiments, the dummy gate 314 or 316 and/or gate spacers 318 limit the source/drain structures 118, 120, 122 and 124 to the source/drain regions 126, and the hard mask limits the source/drain structures horizontally within the source/drain regions 126. In many embodiments, the source/drain structures 118, 120, 122 and 124 are formed by one or more epitaxy or epitaxial (epi) processes, whereby Si features, SiGe features, SiC features, and/or other suitable features are grown in a crystalline state on the channel regions 110b and 112b. Suitable epitaxy processes include CVD deposition techniques (e.g., vapor-phase epitaxy (VPE) and/or ultra-high vacuum CVD (UHV-CVD)), molecular beam epitaxy, and/or other suitable processes. The epitaxy process may use gaseous and/or liquid precursors, which interact with the composition of the channel regions 110b and 112b.

The source/drain structures 118, 120, 122 and 124 may be in-situ doped during the epitaxy process by introducing doping species including: p-type dopants, such as boron or BF2; n-type dopants, such as phosphorus or arsenic; and/or other suitable dopants including combinations thereof. If the source/drain structures 118, 120, 122 and 124 are not in-situ doped, an implantation process (i.e., a junction implant process) is performed to dope the source/drain structures 118, 120, 122 and 124. In an exemplary embodiment, the source/drain structures 118, 120, 122 and 124 in an NMOS include SiCP or SiP, while those in a PMOS include GeSnB (tin may be used to tune the lattice constant) and/or SiGeSnB. One or more annealing processes may be performed to activate the source/drain structures 118, 120, 122 and 124. Suitable annealing processes include rapid thermal annealing (RTA) and/or laser annealing processes. In another embodiment, the source/drain structures 118, 120, 122 and 124 impart additional strain to their adjoining channel regions 110b and 112b. In particular, the source/drain structures 118 and 122 impart additional tensile strain to the channel region 110b and the source/drain structures 120 and 124 impart additional compressive strain to channel region 112b.

Figure 3J:
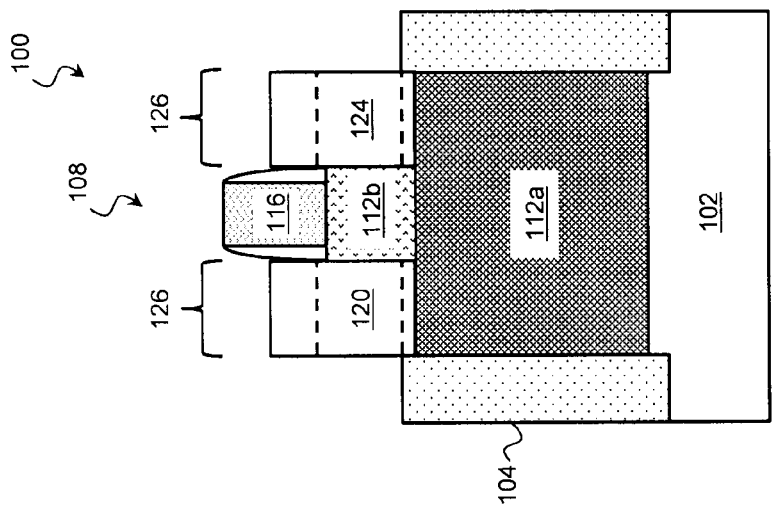
Figure 3I:
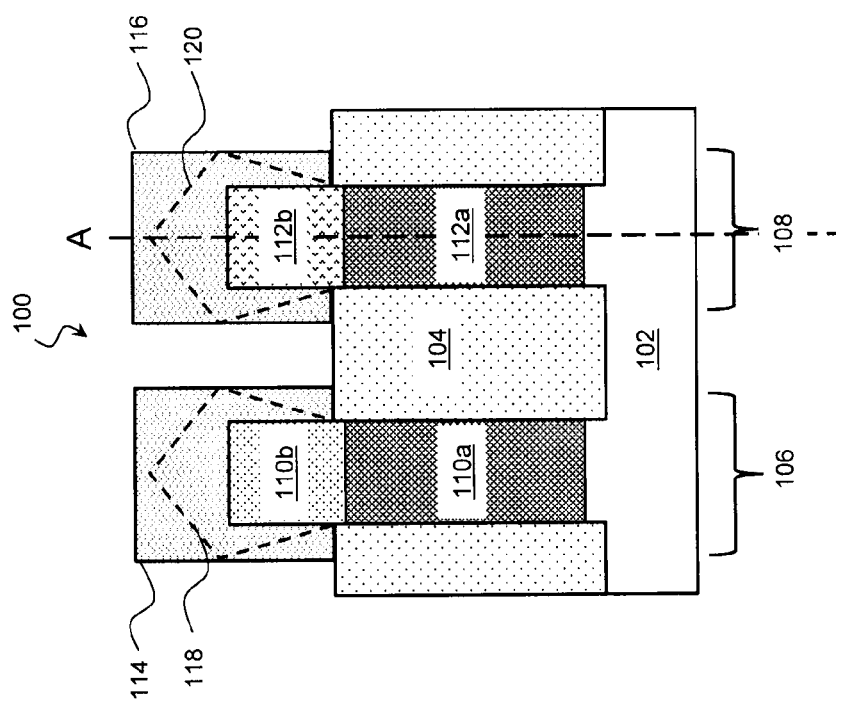

Moving to operation 222 and referring to FIGS. 3I and 3J (which is a cross-section of FIG. 3I along line A-A), gate structures 114 and 116 are formed on top of channel regions 110b and 112b, respectively. In some embodiments, an inter-level dielectric (ILD) is formed on the source/drain structures 118, 120, 122 and 124 in the source/drain regions 126. The ILD may surround the dummy gate 314 or 316 and/or gate spacers 318 allowing these features to be removed and replacement gates 114 and 116 to be formed in the resulting cavity. Accordingly, in such embodiments, the dummy gate 314 or 316 is removed after depositing the ILD. The ILD may also be part of an electrical interconnect structure that electrically interconnects other devices on the same substrate as semiconductor device 100. In such embodiments, the ILD acts as an insulator that supports and isolates the conductive traces. The ILD may include any suitable dielectric material, such as a semiconductor oxide, a semiconductor nitride, a semiconductor oxynitride, a semiconductor carbide, other suitable materials, and/or combinations thereof. In some embodiments, the formation of the ILD includes deposition and CMP.

The dummy gate 314 or 316 is removed, resulting in a gate trench. In some embodiments, the dummy gate 314 or 316 is removed by a process, such as a wet etch, to selectively etch the dummy gate 314 or 316. The etching may include multiple etching steps to respective dummy gate layers. Gate structures 114 and 116 are formed wrapping around the channel regions 110b and 112b of the channel regions 110b and 112b. The gate structures 114 and 116 are formed in the gate trench by a procedure, such as a procedure that includes deposition and CMP. Although it is understood that the gate structures 114 and 116 may be any suitable gate structure, in some embodiments, gate structures 114 and 116 are a high-k metal gate that includes a gate dielectric layer, and a gate electrode layer that each may include a number of sub-layers.

In one such embodiment, the gate dielectric layer includes an interfacial layer deposited by a suitable method, such as ALD, CVD, ozone oxidation, etc. The interfacial layer may include silicon oxide, HfSiO, silicon nitride, silicon oxynitride, and/or other suitable material. In some embodiments, the gate dielectric layer includes a high-k dielectric layer deposited on the interfacial layer by a suitable technique, such as ALD, CVD, metal-organic CVD (MOCVD), PVD, thermal oxidation, combinations thereof, and/or other suitable techniques. The high-k dielectric layer may include LaO, AlO, ZrO, TiO, Ta2O5, Y2O3, SrTiO3 (STO), BaTiO3 (BTO), BaZrO, HfZrO, HfLaO, HfSiO, LaSiO, AlSiO, HfTaO, HfTiO, (Ba,Sr)TiO3 (BST), Al2O3, Si3N4, oxynitrides (SiON), or other suitable materials.

The gate electrode layer is then formed by ALD, PVD, CVD, or other suitable process, and may include a single layer or multiple layers, such as a metal layer, a liner layer, a wetting layer, and/or an adhesion layer. The gate electrode layer may include Ti, Ag, Al, TiAlN, TaC, TaCN, TaSiN, Mn, Zr, TiN, TaN, Ru, Mo, Al, WN, Cu, W, or any suitable materials. In some embodiments, different metal gate materials are used for nMOS and pMOS devices. A CMP process may be performed to produce a substantially planar top surface of the gate structures 114 and 116. After the gate structures 114 and 116 are formed, the semiconductor device 100 may be provided for further fabrication, such as contact formation and further fabrication of the interconnect structure.

The structure resulting from method 200 is a pair of n-type and p-type finFETs 106 and 108, respectively. Channel region 112b is a p-type channel because it is compressively strained while channel region 110b is an n-type channel because it is tensile strained. Thus method 200 produces both n-type and p-type finFETs at the same time using only one round of epitaxial growth or deposition for both the n-type and the p-type finFETs, and obtaining n-type properties in channel region 110b from the annealing process 312. The annealing process 312 is very quick compared to epitaxial growth or deposition, thus method 200 provides a time savings over methods which require epitaxial growth or deposition of the n-type and p-type materials separately.

Although not intended to be limiting, one or more embodiments of the present disclosure provide many benefits to a semiconductor device and the formation thereof. For example, embodiments of the present disclosure provide structures of and methods for bulk finFETs having n-type and p-type channel fins composed of the same material stack. This allows manufacturing of devices in a shorter time frame, as only one epitaxial growth process phase need be used to obtain both n-type and p-type finFETs. Various embodiments of the present disclosure can be implemented with low complexity and low manufacturing cost.

In an exemplary aspect, the present disclosure is directed to a method of forming a semiconductor device. The method includes receiving a substrate having first and second fins projecting through an isolation structure over the substrate. The method further includes etching a portion of the first and second fins, resulting in first and second trenches; and simultaneously growing a first and a second epitaxial layer in the first and second trenches. The method further includes recessing the isolation structure, resulting in a first portion of the first epitaxial layer of the first fin projecting over the isolation structure, a second portion of the first epitaxial layer of the first fin surrounded by the isolation structure. The method further includes applying a patterned thermal mask which leaves exposed the first epitaxial layer of the first fin. The method further includes performing an annealing process, thereby reversing strain on the first epitaxial layer of the first fin.

In another exemplary aspect, the present disclosure is directed to a semiconductor device. The semiconductor device includes a substrate; an isolation structure over the substrate; and a first and second fin structure projecting from the substrate above the isolation structure. The first and second fin structure consist of two epitaxial layers over the substrate, wherein a first portion of the first epitaxial layer is projecting above the isolation structure, a second portion of the first epitaxial layer is surrounded by the isolation structure, and the second epitaxial layer is surrounded by the isolation structure. The portion of the first epitaxial layer that projects above the isolation structure has a tensile stress in the first fin structure and a compressive stress in the second fin structure. The semiconductor device further includes gate structures over the isolation structure and engaging the portion of the first epitaxial layer of each fin that projects above the isolation structure on the top and two sides. The semiconductor device further includes source/drain structures over the isolation structure and engaging the portion of the first epitaxial layer of each fin that projects above the isolation structure on the sides which the gate structures do not engage.

The foregoing outlines features of several embodiments so that those of ordinary skill in the art may better understand the aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a semiconductor device, comprising the steps of:
    receiving a semiconductor substrate comprised of a first semiconductor material and having a plurality of isolation features, thereby defining a first active region and a second active region;
    simultaneously forming a first fin feature comprised of a second semiconductor material in the first active region and a second fin feature comprised of the second semiconductor material in the second active region;
    forming a patterned thermal mask on a surface of the semiconductor substrate such that the first fin feature is left exposed; and,
    performing an annealing process on the first fin feature to reverse a strain in the first fin feature.

2. The method of claim 1, wherein the step of simultaneously forming the first and second fin features further comprises the steps of:
    etching a first and a second trench in the isolation features;
    performing a first epitaxial growth with a third semiconductor material to form a first and a second strain relaxed buffer in a bottom portion of the first and second trenches, respectively;
    performing a second epitaxial growth with a second semiconductor material to form a first and a second fin feature on top of the first and the second strain relaxed buffers in the first and second trenches, respectively; and,
    recessing a first region of the isolation structure surrounding the first fin feature, exposing sidewalls of the first fin feature.

3. The method of claim 2, wherein the first, second and third semiconductor materials are different from each other.

4. The method of claim 1, wherein the patterned thermal mask is comprised of a material which is capable of reflecting the energy of the annealing process.

5. The method of claim 1, wherein the patterned thermal mask is a contact etch stop layer.

6. The method of claim 1, wherein the patterned thermal mask is a distributed Bragg reflector.

7. The method of claim 6, wherein the distributed Bragg reflector is calibrated to reflect light having a wavelength around 532 nm, and is comprised of 10 layers of $Si_3N_4$ and 10 layers of $SiO_2$ which alternate, wherein each layer is 75 nm thick.

8. The method of claim 1, wherein the annealing process is one of a laser annealing process or a flash annealing process.

9. The method of claim 1, wherein the annealing process selectively changes the first fin feature from a compressive stress to a tensile stress while the second fin feature has a tensile stress that remains unchanged through the annealing process.

10. A method of forming a semiconductor device, comprising:
    forming a first fin feature and a second fin feature on a semiconductor substrate, wherein the first and second fin features have a first type strain;
    forming a patterned thermal mask on the semiconductor substrate such that the first fin feature is left exposed; and,
    performing an annealing process using the patterned thermal mask such that the first fin feature is reversed to a second type strain opposite from the first type strain while the second fin feature remains with the first type strain through the annealing process.

11. The method of claim 10, comprising:
    prior to the forming the patterned thermal mask, recessing a first region of an isolation structure surrounding the first fin feature to expose sidewalls of the first fin feature.

12. The method of claim 11, comprising:
    after the performing the annealing process, recessing a second region of the isolation structure surrounding the second fin feature to expose sidewalls of the second fin feature.

13. The method of claim 10, wherein the forming the first fin feature and the second fin feature on the semiconductor substrate includes:
    etching a first trench and a second trench in an isolation structure of the semiconductor substrate;
    performing a first epitaxial growth with a first semiconductor material to form a first and a second strain relaxed buffer in a bottom portion of the first and second trenches, respectively; and
    performing a second epitaxial growth with a second semiconductor material to form the first fin feature over the first strain relaxed buffer and form the second fin feature on top of the second strain relaxed buffer.

14. The method of claim 13, wherein the first semiconductor material is different from the second semiconductor material.

15. The method of claim 13, wherein the second semiconductor material has a higher mobility than Si.

16. The method of claim 13, wherein the second semiconductor material is selected from the group consisting of SiGe, Ge, GeSn, InGaP, InAs, InP, InGaAs, GaAs, InSb, GaSb, and AlGaAs.

17. The method of claim 13, wherein the first semiconductor material is $Si_{1-x}Ge_x$ and the second semiconductor material is $Si_{1-y}Ge_y$ where x<1 and x<y.

18. The method of claim 10, comprising:
   forming an n-type finFET on the first fin feature; and
   forming a p-type finFET on the second fin feature.

19. The method of claim 18, wherein the forming the n-type FinFET includes:
   forming a source and a drain of the n-type finFET using a third semiconductor material that imparts additional tensile strain to the first fin feature;
   wherein the forming the p-type FinFET includes:
      forming a source and a drain of the p-type finFET using a fourth semiconductor material that imparts additional compressive strain to the second fin feature.

20. The method of claim 19, wherein the third and fourth semiconductor material are different from each other.

* * * * *